United States Patent [19]

Grebinski, Jr. et al.

[11] Patent Number: 4,982,753
[45] Date of Patent: Jan. 8, 1991

[54] WAFER ETCHING, CLEANING AND STRIPPING APPARATUS

[75] Inventors: Thomas J. Grebinski, Jr., Santa Clara; Samuel H. Stephenson, Mountain View, both of Calif.

[73] Assignee: National Semiconductor Corporation, Santa Clara, Calif.

[21] Appl. No.: 253,911

[22] Filed: Oct. 6, 1988

Related U.S. Application Data

[63] Continuation of Ser. No. 517,291, Jul. 26, 1983, abandoned.

[51] Int. Cl.$^5$ ................................. B08B 3/02
[52] U.S. Cl. .......................... 134/95; 134/99; 134/102; 134/200; 239/102.1; 239/422; 137/835
[58] Field of Search ............... 134/94, 95, 99, 102, 134/200; 237/102.1, 422; 137/835

[56] References Cited

U.S. PATENT DOCUMENTS

| | | |
|---|---|---|
| 1,608,833 | 11/1926 | Birkenmaier et al. |
| 1,786,394 | 12/1930 | Tracy |
| 3,182,671 | 5/1965 | Vorie |
| 3,630,804 | 12/1971 | Coffman et al. |
| 3,727,620 | 4/1973 | Orr .................................. 134/95 |
| 3,760,822 | 9/1973 | Evans ............................... 134/99 |
| 3,769,992 | 11/1973 | Walestad ......................... 134/144 |
| 3,970,249 | 7/1976 | Singer ............................. 239/102 |
| 3,990,462 | 11/1976 | Elftmann et al. ............... 134/102 |
| 4,052,002 | 10/1977 | Stouffer et al. ............. 137/835 X |
| 4,055,300 | 10/1977 | Binoche ........................... 239/705 |
| 4,132,567 | 1/1979 | Blackwood ................. 134/102 X |
| 4,151,955 | 5/1979 | Stouffer ..................... 137/835 X |
| 4,157,161 | 6/1979 | Bauer ......................... 137/835 X |
| 4,161,356 | 7/1979 | Giffin et al. .................... 134/153 |
| 4,167,193 | 9/1979 | Magnus et al. .................. 134/102 |

*Primary Examiner*—Frankie L. Stinson
*Attorney, Agent, or Firm*—Venable, Baetjer and Howard

[57] ABSTRACT

A wafer stripping, cleaning and etching apparatus includes a bowl, a table in the bowl carrying cassette of wafers, and a spray post with multiple fluid passages and ports directing fluid spray against the wafers.

10 Claims, 1 Drawing Sheet

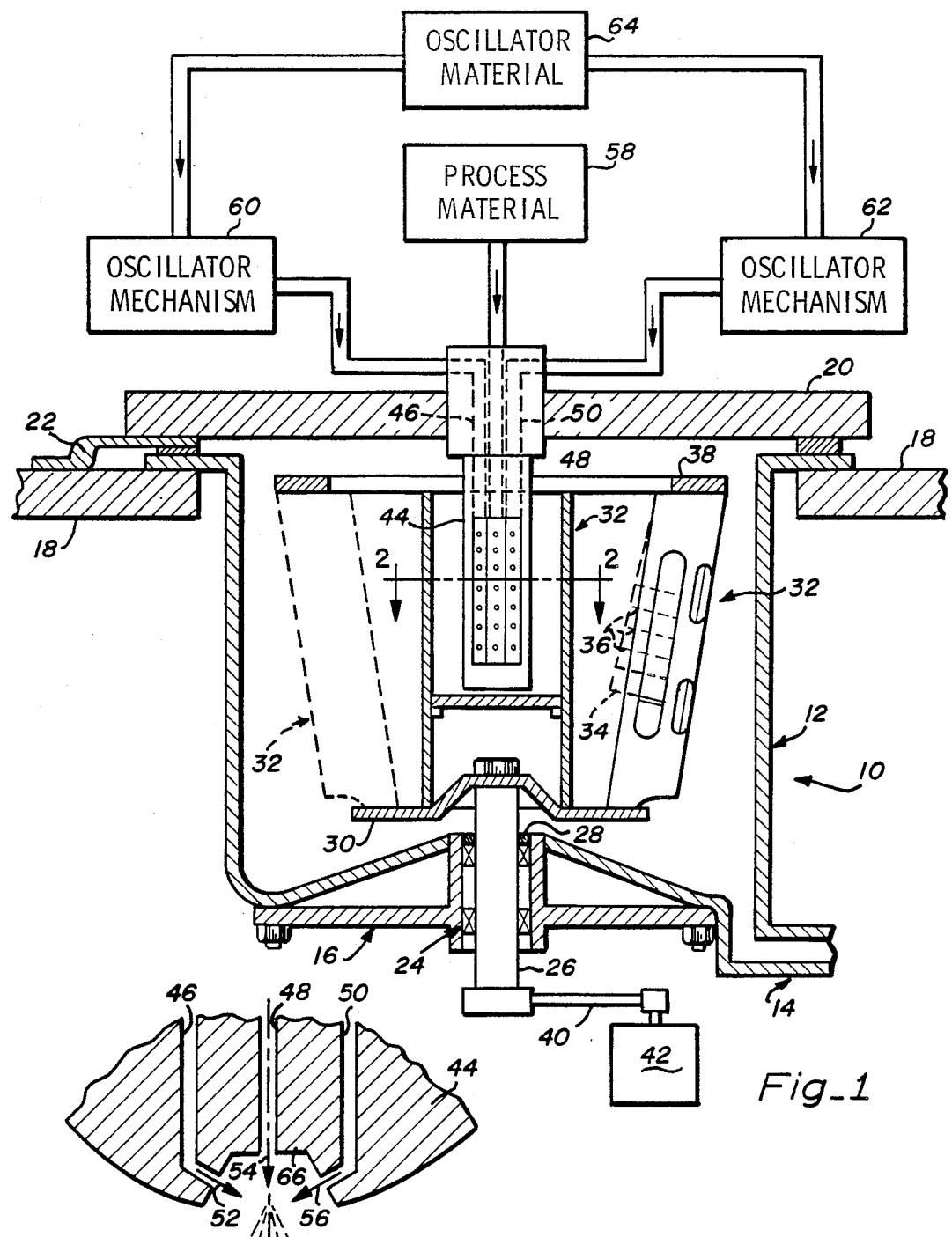

WAFER ETCHING, CLEANING AND STRIPPING APPARATUS

This application is a continuation of application Ser. No. 517,291, filed July 26, 1983 and now abandoned.

BACKGROUND OF THE INVENTION

In the processing of wafers used in the manufacture of integrated circuits, it is necessary in various processing steps to accomplish etching of certain areas of the wafer, to remove photoresist coating which may be applied to the wafer, and to otherwise clean the wafer. The use of an acid is required in all of these processing steps.

An example of apparatus which is directed toward these process steps is disclosed in U.S. Pat. No. 3,990 462, to Elftmann et al. As disclosed therein, wafers are disposed in cassettes in turn mounted on a rotary turntable. A central post defines a plurality of pairs of ports, each port positioned to direct fluid therefrom onto an adjacent wafer as that wafer passes due to the rotary motion of the turntable. As disclosed in that patent, one port of each pair carries acid or water, while the other port carries gas, such as gaseous nitrogen, or air. Each pair of ports is positioned so that, with continuous fluid flow from that pair, an atomized fog-type spray is provided to the wafer.

It will readily be understood that processing of such wafers must be done in an extremely even manner, so that all parts of the wafer are processed properly and uniformly. This has been a problem in the type of apparatus disclosed in the above-cited patent. Futhermore, the processing of a wafer in such a system is relatively slow.

In U.S. Pat. No. 3,970,249 to Singer, secondary streams of gas are alternatively applied to a stream of atomized particles by applying those particles to a substrate. The system thereof, however, is not applicable to processing semiconductor wafers, in particular the removal of material from a semiconductor wafer through etching, stripping or cleaning.

Of more general interest in this are U.S. Pat. No. 3,769,992 to Wallestad and U.S. Pat. No. 3,727,620 to Orr.

SUMMARY OF THE INVENTION

It is accordingly an object of this invention to provide apparatus for efficiently stripping, etching and cleaning wafers.

Broadly stated, the invention comprises a semiconductor wafer processing apparatus comprising a body defining first and second adjacent ports through which fluid may flow from the body, the ports being positioned so that fluid flow from the first port influences fluid flow from the second port, means for varying fluid flow from the first port, and means for supporting a wafer such that at least a portion of the fluid flow moves generally across a major surface of a so-supported wafer.

BRIEF DESCRIPTION OF THE DRAWINGS

Other objects of the invention will become apparent from a study of the following specification and drawings, in which:

FIG. 1 is a sectional view taken though an apparatus incorporating the present invention; and FIG. 2 is a sectional view taken along the line 2—2 of FIG. 1.

DESCRIPTION OF THE PREFERRED EMBODIMENT

Shown in FIG. 1 is an overall embodiment 10 of the wafer cleaning, etching and stripping apparatus. The apparatus 10 includes a bowl 12 having an outlet 14 through which fluid may exit. The bowl 12 is bolted to a fixed base 16. The bowl 12 has a suitable top 18 and cover 20, the cover 20 having a hinge 22 to allow opening and closing thereof. A suitable latch or clamp is provided for holding the cover 20 in its closed position. Bearings 24 on the base 16 mount a rotary drive shaft 26 which extends upwardly through an opening in the bowl 12 and through a suitable seal or bushing 28 mounted on the base 16.

A table 30 is mounted to the shaft 26 within the bowl 12. The table 30 has fixed thereto a plurality of spaced carriers 32 each configured to hold a cassette 34 in turn holding wafers 36. The tops of the carriers 32 are fixed to a continuous ring 38.

The shaft 26 is connected through a drive belt 40 to a motor 42. Operation of the motor 42 rotates the table 30, carriers 32, cassettes 34, and wafers 36. However, as will be described further on, the table 30 may with advantage also be held in fixed position relative to the bowl 12.

A spray post 44 is fixed to and suspended from the cover 20. The spray post 44 defines passages 46, 48, and 50 which in turn are connected respectively to numerous sets of first, second and third ports 52, 54, and 56. The passage 48, connected to port 54, is in turn connected to a source of process material 58 such as, for example, acid. The passages 46 and 50, in turn connected to respective ports 52 and 56, each are connected to an oscillator mechanisms 60 and 62, which are fed material from a source 64 in the form of a gas such as $N_2$. The positioning and configuration of one set of three ports is shown in detail in FIG. 2.

As shown therein, the ports 52, 54, and 56 are positioned in an elongated channel 66 defined by the post 44, with the ports 52, 54, and 56 in substantially the same plane, perpendicular to the longitudinal axis of the post 44. That plane is substantially coplanar with the plane of the particular wafer 68 held by a cassette and which is to be processed (FIG. 2) The port 54 is positioned generally between the ports 52 and 56. The oscillator mechanism 60 associated with the port 52 provides a varying, in fact on-and-off, flow of gas from the port 52. Likewise, the oscillator mechanism 62 associated with the port 56 provides a varying, in fact on-and-off, flow of gas from the port 56. Process material flows from the port 54, as set forth above, and the content and flow thereof can be varied as chosen. In the preferred embodiment, process material flows continuously from the port 54, and flow from each of the ports 52 and 56 is made to alternate in an on-and-off manner. The timing of this flow is such that during a period of time flow from port 52 is on while flow from port 56 is off, and during a period of time flow from port 56 is on while flow from port 52 is off. This, along with positioning of the ports 52, 54, and 56, results in flow of ports 52 and 54 combining to flow on one side of wafer center line 70, and in flow of ports 54 and 56 combining to flow on the other side of such center line 70, during such time periods. It will be seen that the ports 52, 54 and 56 are positioned so that flow of fluid from the port 52 influences the flow of fluid from the port 54, and also flow of fluid from the port 56 influences flow of the fluid from the port 54. Because of the positioning of the wafer in relation to the ports as described above, fluid flow of ports 52 and 54 combines to flow generally across a portion of one or both major surfaces about the center line 70 (top surface shown at 68) of the wafer. This is also the case of fluid flow combined from ports 54 and 56. It is seen that the wafer is supported so that the plane thereof lies generally in the same plane in which fluid flows thereacross when fluid is not being influenced by ports 52 and/or 56.

Depending upon the operation to be undertaken, flow of fluid from port 52 can overlap with flow of fluid from port 56, or there can be an interval during which there is no flow of fluid from either of these ports 52 and 56.

A significant advantage is to be gained in the embodiment where the table 30 does not rotate. In such a situation, the post 44 defines as many channels 66 with sets of ports associated therewith as there are carriers 32. Prior to use of the device, the table 30 is positioned such that each carrier 32 is lined up with a channel 66. Efficient cleaning, etching and/or stripping is achieved through the oscillating action of the multiple ports described above.

This system has numerous advantages. For example, in the prior art, it was necessary to balance the rotary table with wafers and cassettes so that the table would rotate smoothly. This is not necessary in this embodiment, since table rotation does not take place. It has further been found that a spin-dry of the wafers is not necessary because of the oscillating nature described above. Furthermore, such a system avoids excessive acid waste. This is a problem in the prior art system because acid flows between the carriers as the turntable rotates, and is wasted. Balancing of the wafer load also requires additional wafer handling by the operator, with the possible attendant damage and expense related thereto.

It has been found that the present form of port system, whether used with a rotating or fixed table, provides a great increase in efficiency in cleaning, etching and stripping wafers. It will be seen that the system is extremely simple and trouble-free, minimizing use of labor to operate it.

We claim:

1. A semiconductor wafer processing apparatus comprising:

a body defining first, second and third adjacent ports through which fluid may flow from the body, with said second port being positioned generally between the first and third ports, the ports being positioned so that fluid flow from the first and third ports influences the angle of fluid flow from the second port;

means for varying fluid flow from said first and third ports whereby the angle of fluid flow from said second port is varied; and means for stationarily supporting a wafer such that at least a portion of the fluid flow from the second port moves generally across at least a portion of a major face of a so-supported wafer.

2. The apparatus of claim 1 and further comprising means for providing that during a period of time, fluid flow from the third port is on while fluid flow from the first port is off.

3. The apparatus of claim 2 and further comprising means for providing that during a period of time, fluid flow from said first port is on while fluid flow from said third port is off.

4. The apparatus of claim 3 wherein the second port carries acid, and wherein the first and third ports carry gas.

5. The apparatus of claim 4 wherein said gas is $N_2$.

6. The apparatus of claim 4 wherein the means for supporting a wafer comprise means for supporting a wafer so that the plane thereof lies generally in the same plane in which fluid flows generally thereacross.

7. An apparatus as set forth in claim 1, wherein said means for varying fluid flow serves for providing an oscillatory motion to the fluid flow from said second port and wherein said means for supporting a wafer serves for supporting said wafer so that the plane thereof lies generally in the same plane in which fluid flows thereacross whereby the oscillatory motion of the fluid flow from said second port oscillates said fluid flow back and forth across a center line of said so-supported wafer which bisects said major face of said so-supported wafer.

8. An apparatus as set forth in claim 7, wherein the second port carries acid, and wherein the first and third ports carry gas.

9. An apparatus as set forth in claim 1, wherein the first and third ports carry gas.

10. An apparatus as set forth in claim 1, wherein the means for varying fluid flow operates independently of the fluid flow from the second port.

* * * * *